(12) United States Patent
Saito et al.

(10) Patent No.: US 6,300,997 B1
(45) Date of Patent: Oct. 9, 2001

(54) LIQUID CRYSTAL DISPLAY DEVICE HAVING AN IC CHIP MOUNTED ON A NARROW FILM WIRING BOARD

(75) Inventors: Hirokazu Saito; Isao Kurashima, both of Ome; Kazuhiro Sugiyama, Kunitachi, all of (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/514,753

(22) Filed: Feb. 28, 2000

(30) Foreign Application Priority Data

Mar. 4, 1999 (JP) .................................................. 11-057340

(51) Int. Cl.[7] .................................................. G02F 1/1345
(52) U.S. Cl. .......................... 349/149; 349/150; 349/151; 349/152
(58) Field of Search ..................................... 349/149, 150, 349/151, 152; 257/59

(56) References Cited

U.S. PATENT DOCUMENTS

| | | | |
|---|---|---|---|
| 4,687,300 | * 8/1987 | Kubo et al. | 350/336 |
| 4,799,771 | 1/1989 | Taniguchi | 350/334 |
| 5,016,986 | * 5/1991 | Kawashima et al. | 350/339 R |
| 5,402,255 | * 3/1995 | Nakanishi et al. | 359/88 |
| 5,680,191 | * 10/1997 | Voisin et al. | 349/150 |
| 5,712,493 | * 1/1998 | Mori et al. | 257/59 |
| 5,737,053 | * 4/1998 | Yomogihara et al. | 349/149 |
| 6,052,170 | * 4/2000 | Kobayashi | 349/149 |

FOREIGN PATENT DOCUMENTS 04-147221-A * 5/1992 (JP) .

* cited by examiner

Primary Examiner—William L. Sikes
Assistant Examiner—Tarifur R. Chowdhury
(74) Attorney, Agent, or Firm—Frishauf, Holtz, Goodman, Langer & Chick, P.C.

(57) ABSTRACT

A liquid crystal display panel has a contact terminal arrangement region in a central portion of a projected portion of a segment substrate. Segment terminals are arranged in an upper central portion of the contact terminal arrangement region. Common terminals are arranged on the left and right sides of the upper central portion so as to cross the segment terminals. A film wiring board has contact terminal portions respectively connected to the terminals in the contact terminal arrangement region. Therefore, the width of the film wiring board along its entire length can be smaller than that of the display region. Consequently, the cost is reduced and the reliability of interconnection can be considerably improved.

15 Claims, 5 Drawing Sheets

LIQUID CRYSTAL DISPLAY DEVICE HAVING AN IC CHIP MOUNTED ON A NARROW FILM WIRING BOARD

CROSS-REFERENCE TO RELATED APPLICATION

This application is based upon and claims the benefit of priority from the prior Japanese Patent Application No. 11-057340, filed Mar. 4, 1999, the entire contents of which are incorporated herein by reference.

BACKGROUND OF THE INVENTION

The present invention relates to a liquid crystal display device having a panel connected to an IC chip mounted on a narrow film wiring board.

A liquid crystal display device has a liquid crystal display panel and an IC chip for driving the liquid crystal display panel. U.S. Pat. No. 4,799,771 discloses a liquid crystal display device comprising a liquid crystal display panel and a plurality of IC modules. The IC modules, for driving scanning electrodes and data electrodes, are arranged on sides of the panel. Each IC module is mounted on a film wiring board called a carrier tape, which is generally called a TCP (Tape Carrier Package). The scanning and data electrodes are arranged on each side of the liquid crystal display panel along its entire length. They are connected by, for example, anisotropic conductive adhesive, to lead terminals formed on the carrier tape on which each IC module is mounted. At this time, naturally, the electrodes are positioned and bonded to the lead terminals in every IC chip. Therefore, the more the number of IC modules, the longer the required process time.

Recently, the electrodes of an IC chip can be arranged at a very small pitch, owing to the high integration of IC chips and the progress of the bonding technique. However, so long as the lead terminals formed on a carrier tape are connected to the scanning electrodes or the data electrodes arranged on a liquid crystal display panel, the width of the carrier tape cannot be reduced. This matter will be described in detail with reference to FIG. 5. A liquid crystal display panel 1 is constituted by a segment (data) substrate 2 on the upper side and a common (scanning) substrate 3 on the lower side adhered by a substantially frame-shaped sealing member (not shown), and liquid crystal (not shown) sealed within a space between the substrates 2 and 3 enclosed by the sealing member. The segment substrate 2 is longer than the common substrate 3. A side portion 2a of one of the long sides is projected from a lower edge of the common substrate 3. A number of contact terminals 5 are formed on the lower face of the projected portion 2a.

An IC module 21 of this liquid crystal display device has a film wiring board 22. The film wiring board 22 has a substantially rectangular portion and a square projected portion projected from a central portion of the lower end of the rectangular portion. The width in the lateral direction of the drawing of the rectangular portion is slightly smaller than the width in the lateral direction of the liquid crystal display panel 1. A semiconductor chip 23 made of an LSI or the like, for driving the liquid crystal display panel 1, is mounted on a substantially central portion of the film wiring board 22.

Lead wires 24, 25 and 26 are formed on the upper surface of the film wiring board 22. First ends of the lead wires 24 are connected to electrodes arranged along a long side of the semiconductor chip 23. Second ends thereof are connected to those parts of contact terminals 5 which are located in a central portion of the projected portion 2a of the liquid crystal display panel 1. First ends of the lead wires 25 and 26 are connected to electrodes arranged along the short sides of the semiconductor chip 23. Second ends thereof are connected to those parts of the contact terminals 5 which are arranged in side portions of an end of the projected portion 2a of the liquid crystal display panel 1.

Since the lead wires 24, 25 and 26 are connected to the contact terminals arranged substantially along the entire length of the liquid crystal display panel 1, the width $w_t$ of the film wiring board 22 is almost the same as the width $w_p$ of the liquid crystal display panel 1. Therefore, if film wiring boards 22 are obtained by cutting a long base film, merely a small number of film wiring boards can be produced, resulting in a high cost. In addition, since the mounting area is large, the degree of freedom of mounting is small. Moreover, since the wiring board is liable to receive external force, reliable interconnection cannot be achieved.

BRIEF SUMMARY OF THE INVENTION

An object of the present invention is to reduce the width and area of a film wiring board connected to a liquid crystal display panel, thereby improving the degree of freedom of mounting and the reliability of interconnection.

According to the present invention, there is provided a display device comprising:

a display panel including a display region, which has a substrate and a number of wires formed on the substrate, and a contact terminal arrangement region, the display region of the display panel having a side of a length, the contact terminal arrangement region being shorter than the length of the side of the display region and having a central portion including a plurality of first contact terminals, a left side portion adjacent to the central portion and including a plurality of second contact terminals and a right side portion including a plurality of third contact terminals, the second and third contact terminals extending in directions crossing the first contact terminals, and the wires being respectively connected to the first, second and third contact terminals;

a film wiring board having lead wires, respectively connected to the first, second and third contact terminals; and a semiconductor chip connected to the lead wires of the film wiring board.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
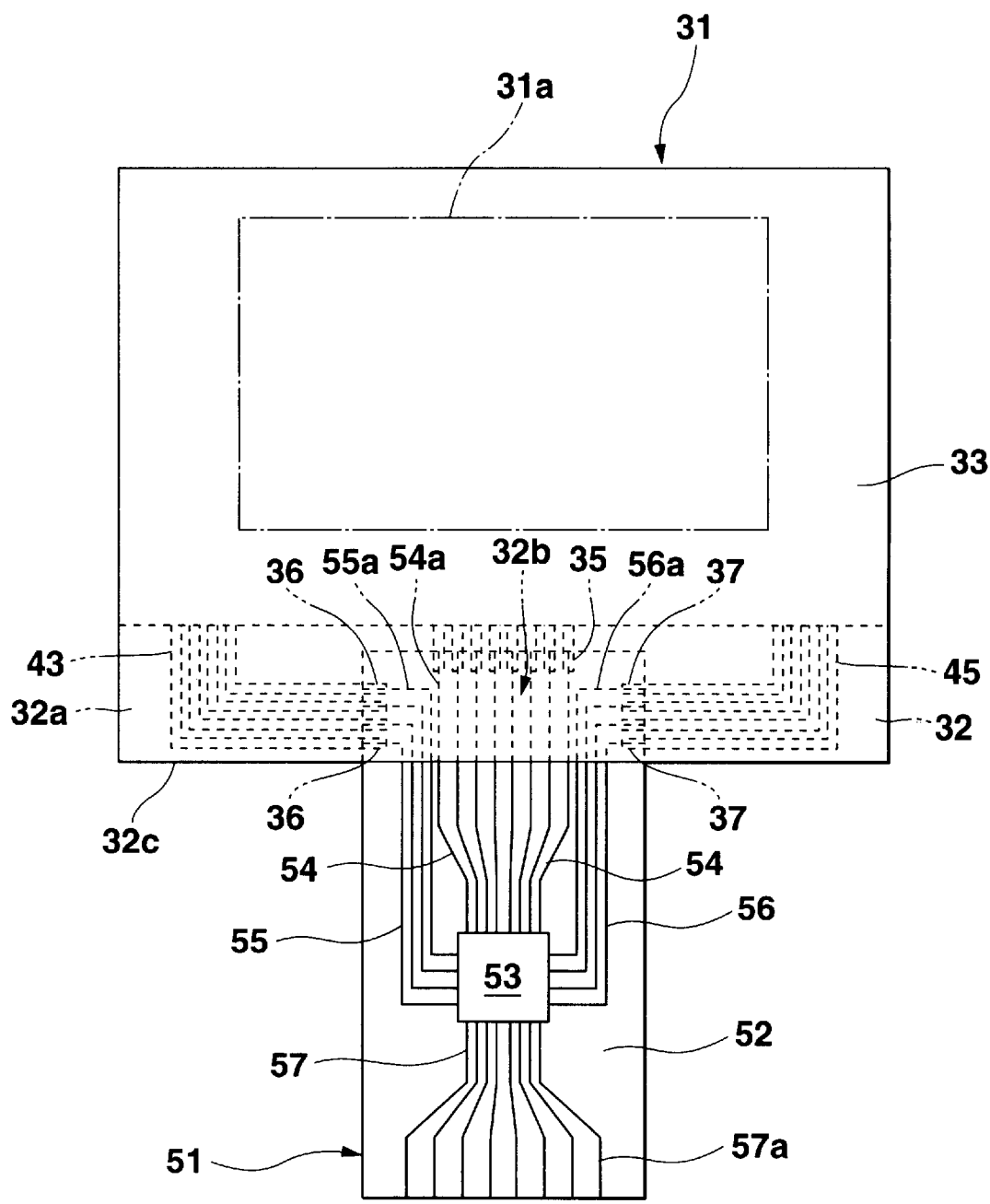
FIG. 1 is a plan view of a liquid crystal display device according to a first embodiment of the present invention.
Figure 2A:
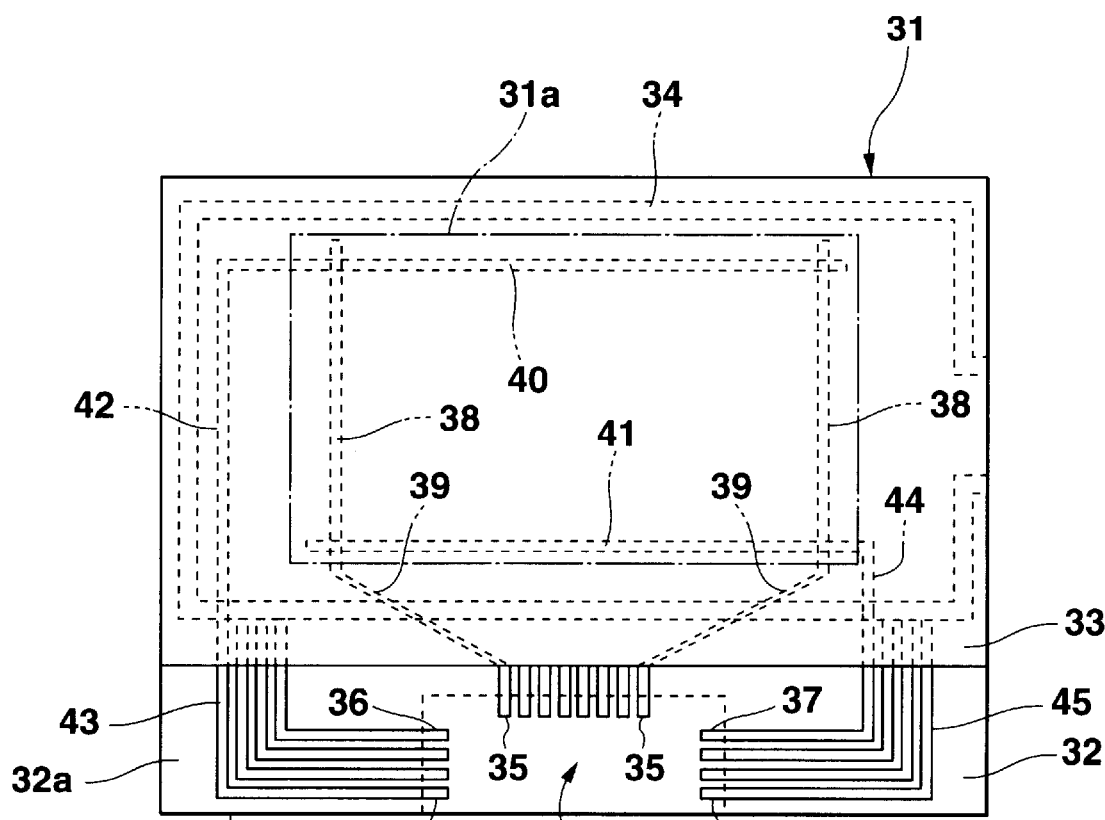
FIG. 2A is a bottom view from the rear side of a liquid cristal display panel constituting the liquid crystal display device shown in FIG. 1.
Figure 2B:
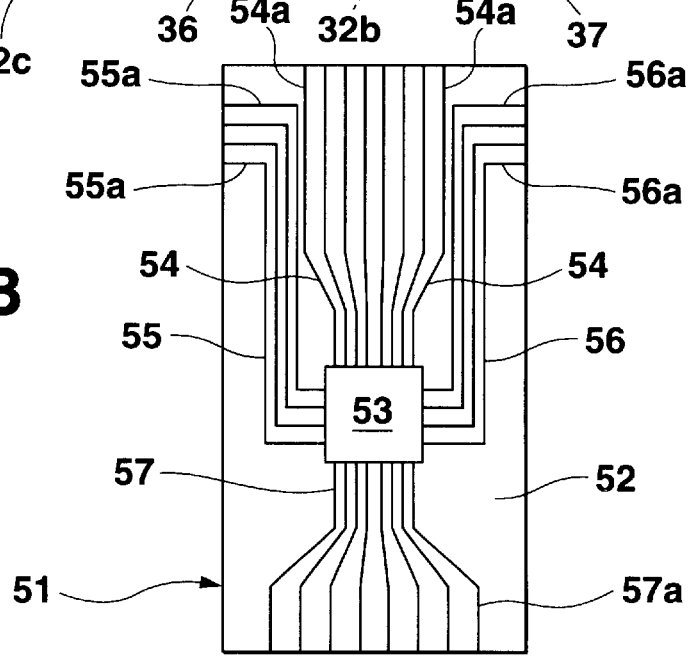
FIG. 2B is a plan view of an IC module constituting the liquid crystal display device shown in FIG. 1.

FIG. 1 is a plan view of a liquid crystal display device according to a first embodiment of the present invention. FIG. 2A is a bottom view from the rear side of a liquid crystal display panel constituting the liquid crystal display device shown in FIG. 1, and FIG. 2B is a plan view of an IC module constituting the liquid crystal display device shown in FIG. 1. The internal structure of a liquid crystal display panel 31 is omitted in FIG. 1, but shown in FIG. 2A. The liquid crystal display panel 31 of the liquid crystal display device is constituted by a segment substrate 32 on the upper side and a common substrate 33 on the lower side, which are adhered by a substantially frame-shaped sealing member 34 provided therebetween, and liquid crystal (not shown) sealed within a space between the substrates 32 and 33 enclosed by the sealing member 34 to constitute a display region. A lower side portion 32a of the segment substrate 32 is projected from a lower side edge of the common substrate 33. Thus, the segment substrate 32 has an overlap region overlapping the common substrate 33 and a non-overlap region not overlapping the substrate 33. A central portion of an undersurface of the projected portion 32a includes a contact terminal arrangement region 32b indicated by the dot line in FIG. 2A. The region 32b is shorter than the display region. A plurality of segment terminals (first contact terminals) 35 are provided in an upper side portion of the region 32b. A plurality of common terminals (second and third contact terminals) 36 and 37 are provided respectively on left and right side portions of the region 32b. The segment terminals 35 extend perpendicular to a lower side edge 32c of the projected portion 32a, and the common terminals 36 and 37 extend parallel to the lower side edge 32c.

A plurality of segment electrodes 38, extending in the column direction, are provided in a central portion of the under surface of the segment substrate 32. The lower ends of the segment electrodes 38 respectively are connected to the segment terminals 35 via leading wires 39 provided in a predetermined portion of the under surface of the segment substrate 32. A plurality of common electrodes 40 and 41, extending in the row direction, are provided in a central portion of the upper surface of the common substrate 33. A region 31a is a display region enclosed by dot-chain lines, in which region the common electrodes 40 and 41 respectively cross the segment electrodes 38. The left end of the common electrodes 40 are respectively connected to the common terminals 36 through leading wires 42 provided in a left portion of the upper surface of the common substrate 33, cross members (not shown) and leading wires 43 provided in a left portion of the under surface of the segment substrate 32. The right ends of the other common electrodes 41 are respectively connected to the common terminals 37 on the right side through leading wires 44 provided in a right portion of the upper surface of the common substrate 33, cross members (not shown) and leading wires 45 provided in a right portion of the under surface of the segment substrate 32. The segment terminals 35 and the common terminals 36 and 37 may be constituted by parts of the leading wires 39, 43 and 45. Alternatively, they may be laminated on the leading wires 39, 43 and 45.

An IC module 51 of the liquid crystal display device includes a film wiring board 52 and a semiconductor chip 53. The film wiring board 52 is rectangular, and the width thereof in the horizontal direction in the drawing is smaller than the length in the vertical direction. The semiconductor chip 53 has a driving circuit for driving the liquid crystal display panel 31. The chip 53 is mounted on a central portion of the upper surface of the film wiring board 52.

The film wiring board 52 has a carrier tape having a thickness of, for example, 25 to 50 μm. A plurality of output lead wires 54 for the segment terminals and output lead wires 55 and 56 for the common terminals are formed in a central portion of an upper side of the upper surface of the film wiring board 52. The lead wires 54, 55 and 56 have a thickness of 6 to 12 μm over the entire lengths. They are formed by, for example, depositing copper directly on the carrier tape and plating the copper with tin. Bump electrodes (not shown) of the semiconductor chip, made of gold, are respectively bonded to first ends of the lead wires 54, 55 and 56. This method of face-down bonding the semiconductor chip 53 to the film wiring board 52 is generally called COF (Chip On Film). In this embodiment, the bonding process can be performed very accurately and efficiently for the following reasons: since the film wiring board 52 is very thin, the heat transmission efficiency is high; since the lead wires 54, 55 and 56 are directly formed on the carrier tape with no adhesive interposed therebetween, no slippage occurs between the carrier tape and the lead wires 54, 55 and 56; and since no adhesive is used, positional deviation due to thermal deformation of adhesive does not occur. Second ends of the lead wires 54, 55 and 56, whose first ends are connected to the semiconductor chip 53, are extended to an upper side end portion of the upper surface of the film wiring board 52, and constitute output lead terminal portions 54a, 55a and 56a. More specifically, the output lead terminal portions 54a for the segment terminals are arranged in an upper central portion of the film wiring board 52 so as to be perpendicular to the upper end of the board 52. The output lead terminal portions 55a for the common electrodes are arranged in an upper left portion of the film wiring board 52 so as to be parallel to the upper end (i.e., perpendicular to the left side). The output lead terminal portions 56a for the common terminals are arranged in an upper right portion of the film wiring board 52 so as to be parallel to the upper end (i.e., perpendicular to the right side). A plurality of input lead wires 57 are formed in a lower portion of the upper surface of the film wiring board 52 and connected to the semiconductor chip 53. In this case, lower end portions of the input lead wires 57 on the lower portion of the film wiring board 52 constitute input contact terminal portions 57a.

The output lead terminal portions 54a for the segment terminals and the output lead terminal portions 55a and 56a for the common terminals of the IC module 51 are respectively connected to the segment terminals 35, the common terminals 36 and 37 of the liquid crystal display panel 31 via anisotropic conductive adhesive (not shown). The input contact terminal portions 57a are inserted into and connected to a female connector of a circuit board (not shown).

As described above, in the liquid crystal display device of this invention, the segment terminals 35 are arranged in the contact terminal arrangement region 32b in the lower central portion of the projected portion 32a of the segment substrate 32 of the liquid crystal display panel 31. The segment terminals 35 extend perpendicular to the longitudinal axis (row direction) of the projected portion 32a. The common terminals 36 and 37 are arranged in the left and the right portions of the contact terminal arrangement region 32b, extending parallel with the longitudinal axis of the projected portion 32a. In the IC module 51, the output lead terminal portions 54a for the segment terminals are arranged in the upper central portion of the film wiring board 52, extending perpendicular to the upper end, and the output lead terminal portions 55a and 56a for the common terminals are arranged in the upper left and right portions of the film wiring board 52, extending parallel to the upper end. Therefore, the width in the portion of the right-left direction of the film wiring board 52 which includes the output lead terminal portions 54a, 55a and 56a can be small, resulting in low cost. In addition, since the mounting area is small, the degree of freedom of mounting is increased. Moreover, since the area which receives external force is reduced, reliability of interconnection can be improved.

Figure 3:
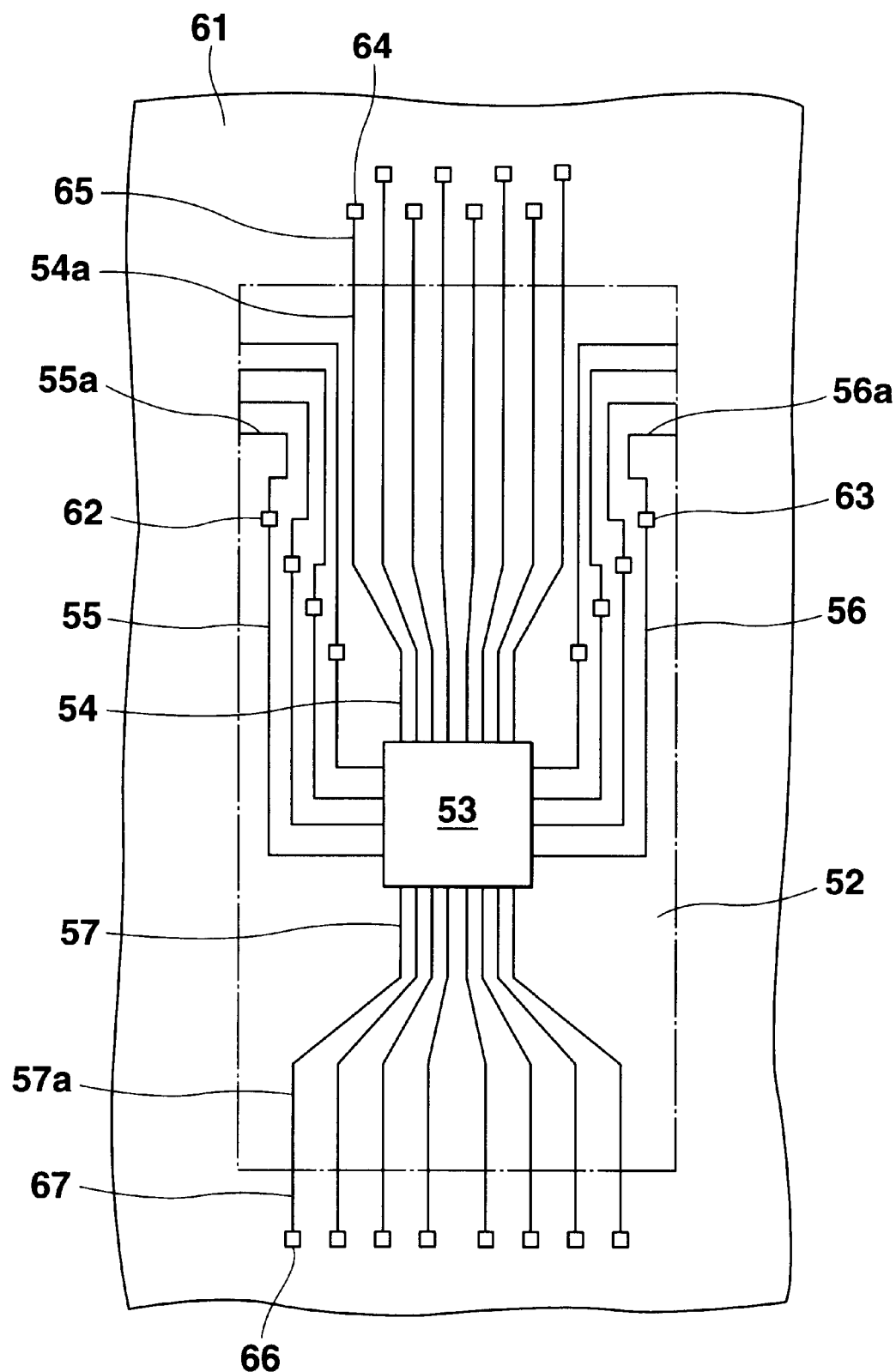
FIG. 3 is a plan view of a main part of a carrier tape having a film wiring board constituting an IC module according to another embodiment.

As regards the IC module 51 described above, after the semiconductor chip 53 is mounted on the film wiring board 52, a test may be carried out to inspect whether the mounting condition (interconnecting condition) is satisfactory. Another embodiment of the present invention, used in the case where such a test is carried out, will be described with reference to FIG. 3. In FIG. 3, the dot-chain line indicates a cut line at which a long carrier tape 61 is cut to produce a film wiring board 52. Test pads 62 and 63 are formed in middle portions of output lead wires 55 and 56 on the upper surface of the film wiring board 52. In this embodiment, the test pads 62 and 63 are respectively arranged at regular intervals on the same lines. Test pads 64 are formed on the upper surface of the carrier tape 61 outside the upper end of the film wiring board 52 and connected to output lead terminal portions 54a for the segment terminals through leading wires 65. Further, test pads 66 are formed on the upper surface of the carrier tape 61 outside the lower end of the film wiring board 52 and connected to input lead terminal portions 57a through leading wires 67.

Test pins (not shown) are brought into contact with the test pads 62, 63, 64 and 66, to inspect whether the semiconductor chip 53 is satisfactorily connected to lead wires 54, 55, 56 and 57. In this embodiment, the test pads 62 and 63 connected to the output lead terminal portions 55a and 56a for the common terminals are provided in the middle portions of the output lead wires 55 and 56 for the common terminals on the upper surface of the film wiring board 52. Therefore, as compared to the case where the test pads 62 and 63 are formed on the upper surface of the base film (carrier tape) 61 outside the left and the right side edges of the film wiring board 52, the test pads require less space in the horizontal direction of the base film 61 in the drawing. Thus, film wiring boards 52 can be continuously formed along the horizontal direction of the base film 61, with the result that a greater number of film wiring boards can be produced.

Figure 4A:
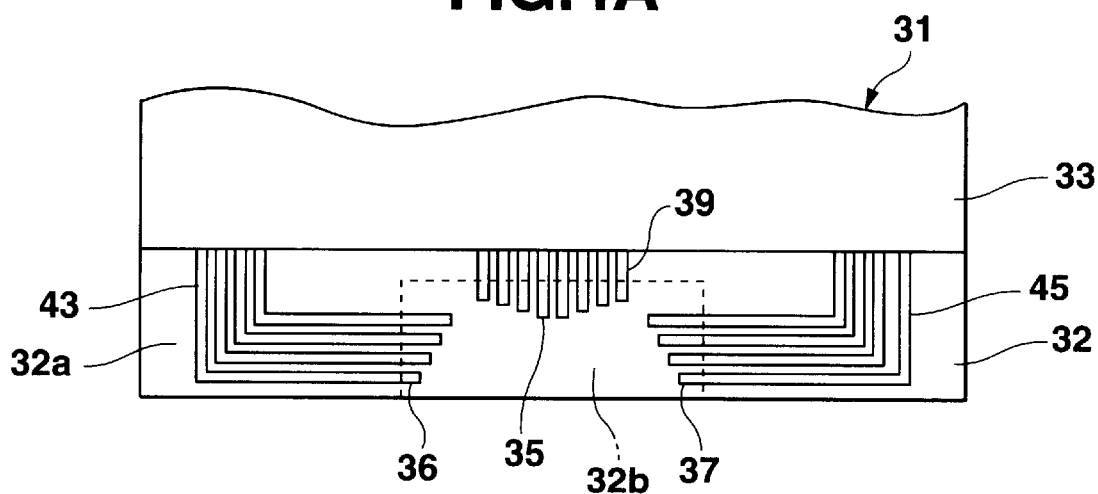
FIGS. 4A to 4C are plan views showing other examples segment terminals and common terminals of a liquid crystal display panel.
Figure 4B:
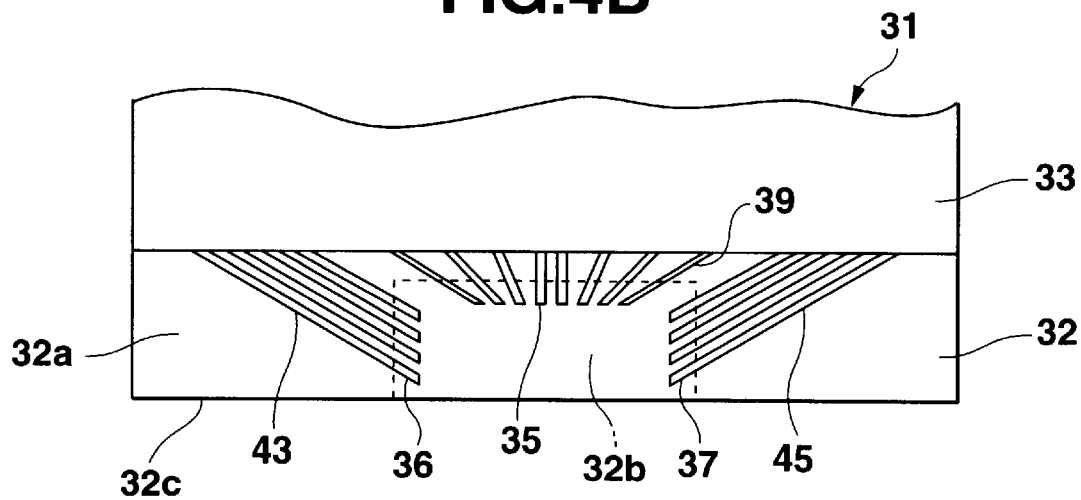
Figure 4C:
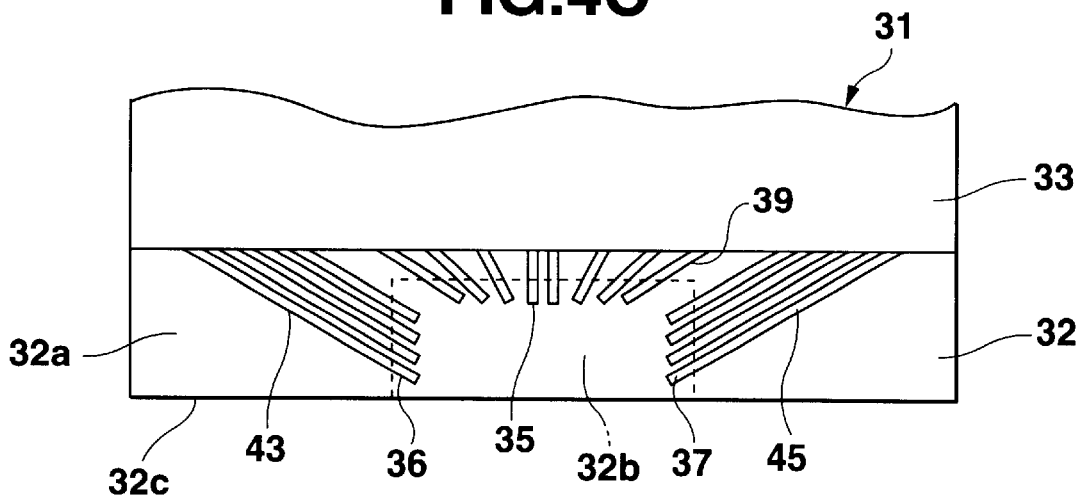
Figure 5:
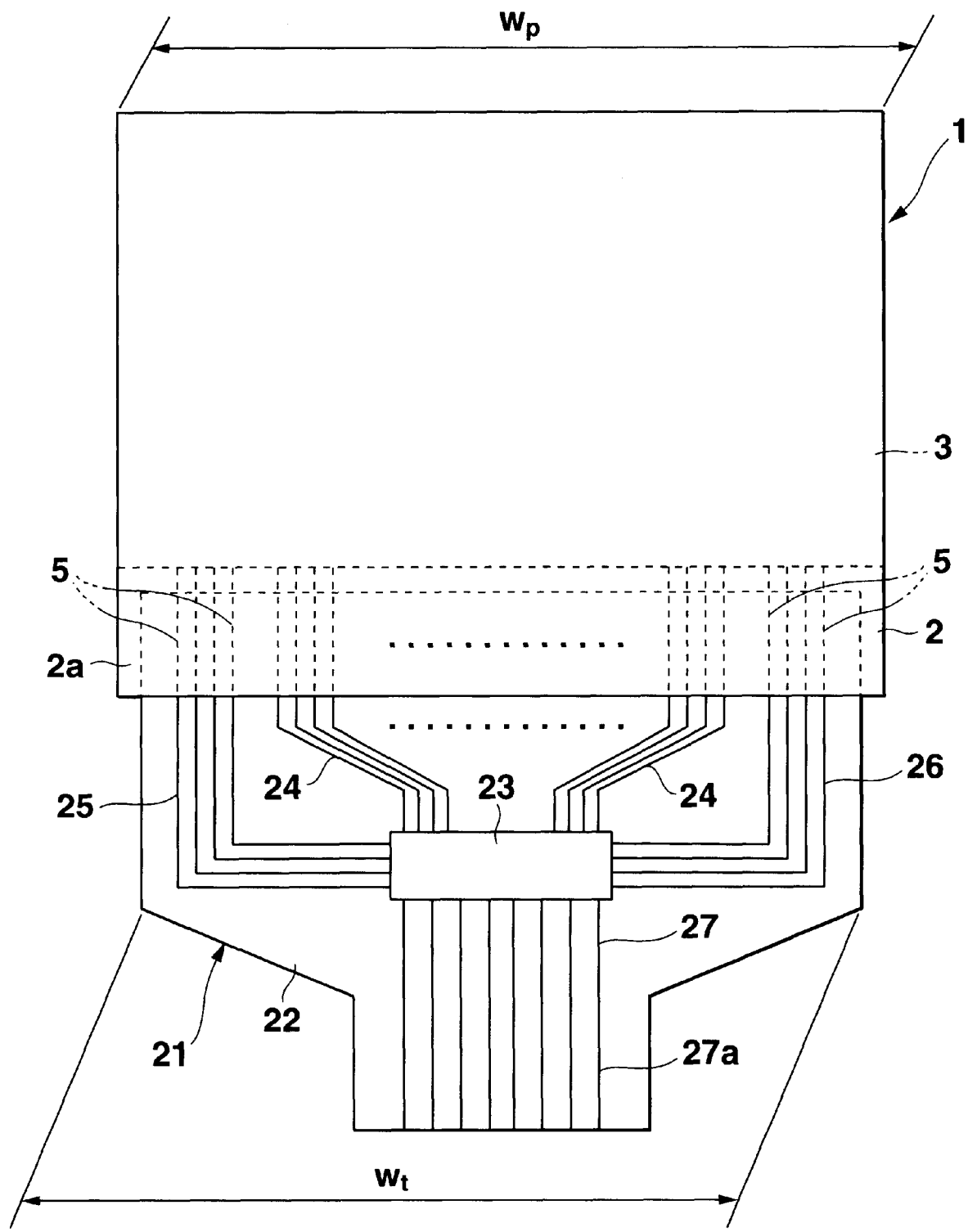
FIG. 5 is a plan view for explaining a problem of the conventional liquid crystal display device.

The arrangement of the segment terminals 35 and the common terminals 36 and 37 is not limited to the above embodiment. For example, as shown in FIG. 4A, the portions of the segment terminals 35 and the common terminals 36 and 37 in the contact terminal arrangement region 32b indicated by the dot line may have different lengths. Further, as shown in FIG. 4B, the portions of the segment terminals 35 and the common terminals 36 and 37 in the contact terminal arrangement region 32b may be inclined at a suitable angle with respect to the lower side edge of the projected portion 32a, i.e., the longitudinal axis of the projected portion 32a, and leading wires 39, 43 and 45 may be continuous to the inclined terminals. In the case of FIG. 4B, the ends of the segment terminals 35 and the common terminals 36 and 37 in the contact terminal arrangement region 32b are cut obliquely with respect to the wires and aligned on the same line. However, as shown in FIG. 4C, the ends of the terminals may be cut to be perpendicular to the leading wires. Further, the leading wires 39, 43 and 45 in FIG. 4A may extend obliquely as shown in FIG. 4B. In FIGS. 4B and 4C, the leading wires 39 may be perpendicular to the longitudinal axis of the projected portion 32a and the leading wires 43 and 45 may be parallel to the longitudinal axis. Needless to say, in the film wiring board 52 to be connected to the region 32b shown in FIG. 4A, 4B or 4C, the output lead terminal portions 54a, 55a and 56a are arranged in accordance with the arrangement of the segment terminals 35 and the common terminals 36 and 37 of the liquid crystal display panel 31.

In the above embodiments, the IC module called COF is used. However, a TCP (tape carrier package) may be used instead. Further, the present invention is applicable not only to a liquid crystal display panel but any type of display panel.

As has been described above, according to the present invention, the width of the film wiring board 52 can be small and the cost can be reduced. In addition, since the mounting area is small, the degree of freedom of mounting is increased. Moreover, since the area which receives external force is reduced, reliability of interconnection can be considerably improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A display device comprising:
    a display panel including a display region which has a substrate and a number of wires formed on the substrate, and a contact terminal arrangement region, the display region of the display panel having a side of a length,
    the contact terminal arrangement region being shorter than the length of the side of the display region and having a central portion including a plurality of first contact terminals, a left side portion adjacent to the central portion and including a plurality of second contact terminals and a right side portion including a plurality of third contact terminals, the second and third contact terminals extending in directions crossing the first contact terminals, and the wires being respectively connected to the first, second and third contact terminals;
    a film wiring board having lead wires, respectively connected to the first, second and third contact terminals; and
    a semiconductor chip connected to the lead wires of the film wiring board.

2. A display device according to claim 1, wherein the lead wires connected to the first contact terminals extend perpendicular to the side of the display region, and the lead wires connected to the second and third contact terminals extend parallel to the side of the display region.

3. A display device according to claim 1, wherein the semiconductor chip is mounted on the film wiring board.

4. A display device according to claim 1, wherein the lead wires connected to the second and third contact terminals extend obliquely with respect to the side of the display region.

5. A display device according to claim 1, wherein the film wiring board includes test pads formed thereon, and at least a part of the lead wires formed on the film wiring board is connected to any one of the first, second and third contact terminals via the test pad.

6. A display device according to claim 1, wherein the contact terminal arrangement region is located in a portion corresponding to a substantially central portion of the side of the display region of the display panel.

7. A display device according to claim 1, wherein the display panel is a liquid crystal display panel.

8. A display device according to claim 7, wherein the wires of the liquid crystal display panel include segment electrodes and common electrodes.

9. A display device according to claim 8, wherein the segment electrodes are respectively connected to the first contact terminals in the contact terminal arrangement region.

10. A display device according to claim 9, wherein the common electrodes are respectively connected to the second and third contact terminals in the contact terminal arrangement region.

11. A display device comprising:

a display panel having a common substrate on which common electrodes are formed and a segment substrate on which segment electrodes are formed, the segment substrate having an overlap region overlapping the common substrate and a non-overlap region not overlapping the common substrate, the overlap region including a display region and the non-overlap region including a contact terminal arrangement region, the contact terminal arrangement region including a plurality of first contact terminals connected to the segment electrodes and a plurality of second contact terminals connected to the common electrodes, and the first contact terminals and the second contact terminals extending in directions crossing each other;

a film wiring board having lead wires connected to the first and second contact terminals; and a semiconductor chip mounted on the film wiring board.

12. A display device according to claim 11, wherein the film wiring board has a same width as that of the contact terminal arrangement region along its entire length.

13. A display device according to claim 12, wherein the film wiring board includes test pads respectively connected to the lead wires.

14. A display device comprising:

a display panel having a display region of a length and a contact terminal arrangement region shorter than the length of the display region, the contact terminal arrangement region including a plurality of first contact terminals and a plurality of second contact terminals, the first contact terminals and the second contact terminals extending in directions crossing each other, and the display panel including a plurality of wires extending from the display region and respectively connected to the first and second contact terminals;

a film wiring board including lead wires connected to the first and second contact terminals and having a substantially same width as that of the contact terminal arrangement region; and a semiconductor chip mounted on the film wiring board.

15. A display device according to claim 14, wherein the film wiring board includes test pads respectively connected to the lead wires.

* * * * *